(12) United States Patent
Lee et al.

(10) Patent No.: US 10,353,285 B2
(45) Date of Patent: *Jul. 16, 2019

(54) PELLICLE STRUCTURES AND METHODS OF FABRICATING THEREOF

(71) Applicant: Taiwan Semiconductor Manufacturing Co., Ltd., Hsinchu (TW)

(72) Inventors: Hsin-Chang Lee, Hsinchu County (TW); Pei-Cheng Hsu, Taipei (TW); Yun-Yue Lin, Hsinchu (TW); Hsuan-Chen Chen, Tainan (TW); Hsuan-I Wang, New Taipei (TW); Anthony Yen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/010,118

(22) Filed: Jun. 15, 2018

(65) Prior Publication Data

US 2018/0292744 A1    Oct. 11, 2018

Related U.S. Application Data

(63) Continuation of application No. 15/380,121, filed on Dec. 15, 2016, now Pat. No. 10,001,701.

(51) Int. Cl.
*G03F 1/22* (2012.01)
*G03F 1/62* (2012.01)
*G03F 1/64* (2012.01)
*G03F 7/20* (2006.01)

(52) U.S. Cl.
CPC ............... *G03F 1/64* (2013.01); *G03F 1/22* (2013.01); *G03F 1/62* (2013.01); *G03F 7/2004* (2013.01)

(58) Field of Classification Search
CPC .................................... G03F 1/62; G03F 1/64
USPC ............................................................ 430/5
See application file for complete search history.

(56) References Cited

U.S. PATENT DOCUMENTS

| | | |
|---|---|---|
| 7,851,109 B2 | 12/2010 | Chakravorty et al. |
| 8,628,897 B1 | 1/2014 | Lu et al. |
| 8,679,707 B2 | 3/2014 | Lee et al. |
| 8,691,476 B2 | 4/2014 | Yu et al. |
| 8,709,682 B2 | 4/2014 | Chen et al. |
| 8,715,890 B2 | 5/2014 | Tu et al. |
| 8,722,286 B2 | 5/2014 | Yu et al. |
| 8,753,788 B1 | 6/2014 | Yu et al. |
| 8,764,995 B2 | 7/2014 | Chang et al. |
| 8,765,330 B2 | 7/2014 | Shih et al. |
| 8,765,582 B2 | 7/2014 | Hsu et al. |
| 8,785,084 B2 | 7/2014 | Lu et al. |
| 8,828,625 B2 | 9/2014 | Lu et al. |
| 8,841,047 B2 | 9/2014 | Yu et al. |
| 8,877,409 B2 | 11/2014 | Hsu et al. |
| 10,001,701 B1 * | 6/2018 | Hsu .......................... G03F 1/64 |

* cited by examiner

*Primary Examiner* — Christopher G Young
(74) *Attorney, Agent, or Firm* — Haynes and Boone, LLP

(57) ABSTRACT

A structure including an EUV mask and a pellicle attached to the EUV mask. The pellicle includes a pellicle frame and a plurality of pellicle membrane layers attached to the pellicle frame. The plurality of pellicle membrane layers include at least one core pellicle membrane layer and an additional pellicle membrane layer is disposed on the at least one core pellicle membrane layer. In some embodiments, the additional pellicle membrane layer is a material having a thermal emissivity greater than 0.2, a transmittance greater than 80%, and a refractive index (n) for 13.5 nanometer source of greater than 0.9.

20 Claims, 7 Drawing Sheets

PELLICLE STRUCTURES AND METHODS OF FABRICATING THEREOF

PRIORITY DATA

The present application is a continuation application of U.S. patent application Ser. No. 15/380,121, filed Dec. 15, 2016, entitled "PELLICLE STRUCTURES AND METHODS OF FABRICATING THEREOF," each of which is hereby incorporated by reference in its entirety.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As merely one example, semiconductor lithography processes may use lithographic templates (e.g., photomasks or reticles) to optically transfer patterns onto a substrate. Such a process may be accomplished, for example, by projection of a radiation source, through an intervening photomask or reticle, onto the substrate having a photosensitive material (e.g., photoresist) coating. The minimum feature size that may be patterned by way of such a lithography process is limited by the wavelength of the projected radiation source. In view of this, extreme ultraviolet (EUV) radiation sources and lithographic processes have been introduced. However, EUV systems, which utilize reflective rather than conventional refractive optics, can be sensitive to contamination issues. In one example, particle contamination introduced onto a reflective EUV mask can result in significant degradation of the lithographically transferred pattern. As such, it is necessary to provide a pellicle membrane over an EUV mask, to serve as a protective cover which protects the EUV mask from damage and/or contaminant particles. While study has provided pellicle membranes of different configurations and/or materials have been satisfactory in some respects, further improvement in their performance and use in volume production may be desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
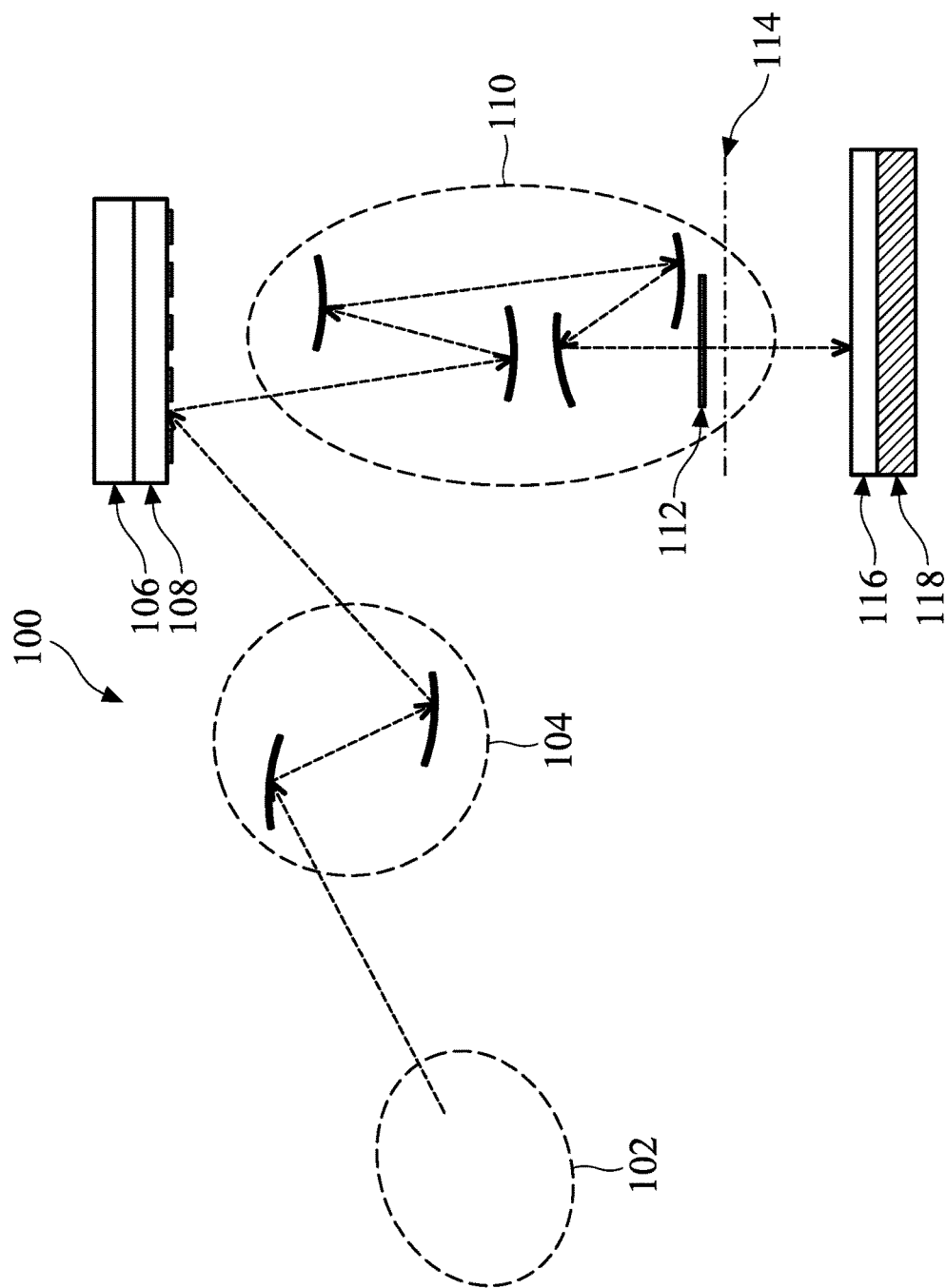
FIG. 1 is a schematic view of a lithography system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Additionally, throughout the present disclosure, the terms "mask", "photomask", and "reticle" may be used interchangeably to refer to a lithographic template, such as an EUV mask.

It is noted that the present disclosure discusses the application of various embodiments of pellicles to EUV lithography processes or EUV masks. However, it will be appreciated that pellicles may now provide benefits in other processes now existing or later developed and aspects of the present disclosure apply to those systems as well.

Illustrated in FIG. 1 is a schematic view of a lithography system 100, in accordance with some embodiments. In various embodiments, the pellicle membrane described herein may be coupled to an EUV mask utilized within the lithography system 100. The lithography system 100 may also be generically referred to as a scanner that is operable to perform lithographic processes including exposure with a respective radiation source and in a particular exposure mode. In at least some of the present embodiments, the lithography system 100 includes an EUV lithography system designed to expose a resist layer disposed on a target substrate by EUV light. Inasmuch, in various embodiments, the resist layer includes a material sensitive to the EUV light (e.g., an EUV resist). In an embodiment, the EUV light is provided at an EUV wavelength such as 13.5 nm. At least some embodiments described herein may include pellicle membranes coupled to a mask utilized within an optical lithography system, such as an optical lithography system using a deep UV (DUV) light source to expose a resist layer sensitive to the DUV light source. By way of example, some DUV light sources may include a KrF excimer laser (e.g., to provide a 248 nm light source), an ArF excimer laser (e.g., to provide a 193 nm light source), or an $F_2$ eximer laser (e.g., to provide a 157 nm light source).

With reference to FIG. 1, the lithography system 100 illustrated includes a plurality of subsystems such as a radiation source 102, an illuminator 104, a mask stage 106 configured to receive a mask 108, projection optics 110, and a substrate stage 118 configured to receive a target substrate, such as semiconductor substrate 116. A general description of the operation of the lithography system 100 may be given as follows: EUV light from the radiation source 102 is directed toward the illuminator 104 (which includes a set of reflective mirrors) and projected onto the mask 108. A reflected mask image is directed toward the projection optics 110, which focuses the light and projects the light onto the semiconductor substrate 116 to expose an EUV resist layer deposited thereupon. Additionally, in various examples, each subsystem of the lithography system 100 may be housed in, and thus operate within, a high-vacuum environment, for example, to reduce atmospheric absorption of EUV light.

In the embodiments described herein, the radiation source 102 may be used to generate the light (e.g., EUV light). In some embodiments, the radiation source 102 includes a plasma source, such as for example, a discharge produced plasma (DPP) or a laser produced plasma (LPP). In some examples, the light may include light having a wavelength ranging from about 1 nanometer (nm) to about 100 nm. In one particular example, the radiation source 102 generates EUV light with a wavelength centered at about 13.5 nm. Accordingly, the radiation source 102 may also be referred to as an EUV radiation source 102. In some embodiments, the radiation source 102 also includes a collector, which may be used to collect EUV light generated from the plasma source and to direct the EUV light toward imaging optics such as the illuminator 104.

As described above, light from the radiation source 102 is directed toward the illuminator 104. In some embodiments, the illuminator 104 may include reflective optics (e.g., for the EUV lithography system 100), such as a single mirror or a mirror system having multiple mirrors in order to direct light from the radiation source 102 onto the mask stage 106, and particularly to the mask 108 secured on the mask stage 106. In some examples, the illuminator 104 may include a zone plate, for example, to improve focus of the EUV light. In some embodiments, the illuminator 104 may be configured to shape the EUV light passing therethrough in accordance with a particular pupil shape, and including for example, a dipole shape, a quadrapole shape, an annular shape, a single beam shape, a multiple beam shape, and/or a combination thereof. In some embodiments, the illuminator 104 is operable to configure the reflective elements (e.g., mirrors of the illuminator 104) to provide a desired illumination to the mask 108. In one example, the elements of the illuminator 104 are configurable to reflect EUV light to different illumination positions. In some embodiments, a stage prior to the illuminator 104 may additionally include other configurable mirrors that may be used to direct the EUV light to different illumination positions within the mirrors of the illuminator 104. In some embodiments, the illuminator 104 is configured to provide an on-axis illumination (ONI) to the mask 108. In some embodiments, the illuminator 104 is configured to provide an off-axis illumination (OAI) to the mask 108. It should be noted that the optics employed in the EUV lithography system 100, and in particular optics used for the illuminator 104 and the projection optics 110, may include mirrors having multilayer thin-film coatings known as Bragg reflectors. By way of example, such a multilayer thin-film coating may include alternating layers of Mo and Si, which provides for high reflectivity at EUV wavelengths (e.g., about 13 nm).

As discussed above, the lithography system 100 also includes the mask stage 106 configured to secure the mask 108. The lithography system 100 may be housed in, and thus operate within, a high-vacuum environment, and in some embodiments the mask stage 106 may include an electrostatic chuck (e-chuck) to secure the mask 108. As with the optics of the EUV lithography system 100, the mask 108 is also typically reflective. Details of the mask 108 are discussed in more detail below with reference to the example of FIG. 2. As illustrated in the example of FIG. 1, light is reflected from the mask 108 and directed towards the projection optics 110, which collects the EUV light reflected from the mask 108. By way of example, the EUV light collected by the projection optics 110 (reflected from the mask 108) carries an image of the pattern defined by the mask 108. In various embodiments, the projection optics 110 provides for imaging the pattern of the mask 108 onto the semiconductor substrate 116 secured on the substrate stage 118 of the lithography system 100. In particular, in various embodiments, the projection optics 110 focuses the collected EUV light and projects the EUV light onto the semiconductor substrate 116 to expose a resist layer (e.g., EUV sensitive resist) deposited on the semiconductor substrate 116. As described above, the projection optics 110 may include reflective optics, as used in EUV lithography systems such as the lithography system 100. In some embodiments, the illuminator 104 and the projection optics 110 are collectively referred to as an optical module of the lithography system 100.

In some embodiments, the lithography system 100 also includes a pupil phase modulator 112 to modulate an optical phase of the EUV light directed from the mask 108, such that the light has a phase distribution along a projection pupil plane 114. In some embodiments, the pupil phase modulator 112 includes a mechanism to tune the reflective mirrors of the projection optics 110 for phase modulation. In some embodiments, the pupil phase modulator 112 utilizes a pupil filter placed on the projection pupil plane 114.

As discussed above, the lithography system 100 also includes the substrate stage 118 to secure the semiconductor substrate 116 to be patterned. In various embodiments, the semiconductor substrate 116 includes a semiconductor wafer, such as a silicon wafer, germanium wafer, silicon-germanium wafer, III-V wafer, or other type of wafer as known in the art. The semiconductor substrate 116 may be coated with a resist layer (e.g., an EUV resist layer) sensitive to EUV light.

In the embodiments described herein, the various subsystems of the lithography system 100, including those described above, are integrated and are operable to perform lithography exposing processes including EUV lithography processes. The lithography system 100 is exemplary only may further include other modules or subsystems which may be integrated with (or be coupled to) one or more of the subsystems or components described herein. Additionally, the schematic representation of the lithography system 100 is exemplary only and other configurations for lithography systems, now known or later developed, are equally applicable to aspects of the present disclosure.

Figure 2:
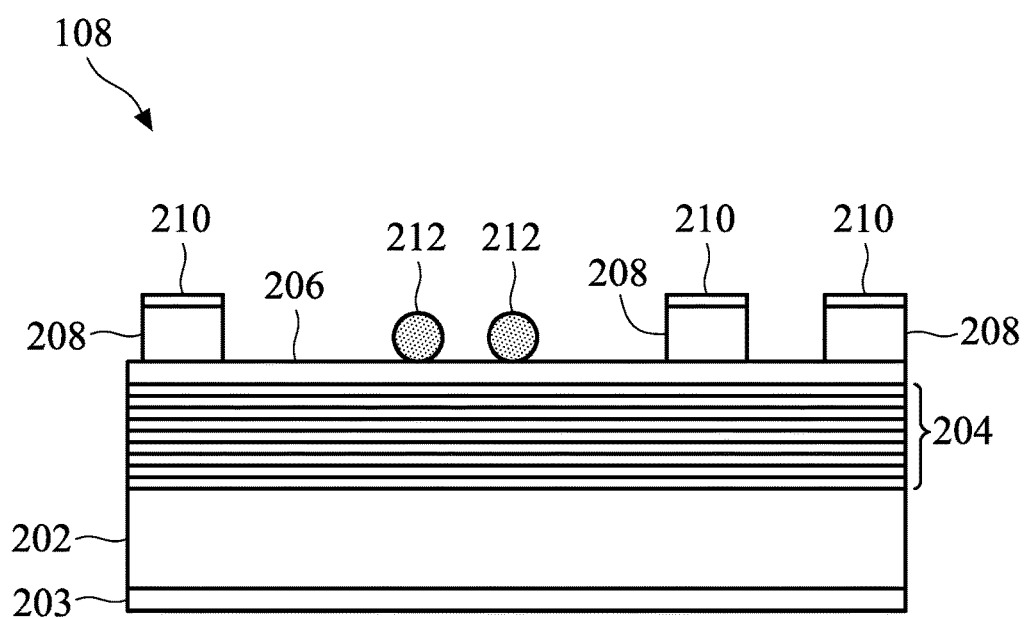
FIG. 2 is a cross-sectional view of an EUV mask, in accordance with some embodiments.

An exemplary mask 108 is described in further detail with respect to the example of FIG. 2. FIG. 2 illustrates an example cross-section of a mask that may be substantially similar to the mask 108 described above with reference to FIG. 1. As shown in FIG. 2, the EUV mask 108 may include a substrate 202 having a backside coating layer 203, a multi-layer structure 204, a capping layer 206, and one or more absorbers 208 having an anti-reflective coating (ARC) layer 210. It is again noted that the mask 108 is exemplary only and may take other forms in other embodiments that may also benefit from aspects of the present disclosure including those with respect to to the embodiments of pellicles presented below.

In some embodiments, the substrate 202 of the mask includes a low thermal expansion material (LTEM) substrate (e.g., such as $TiO_2$ doped $SiO_2$). In an embodiment, the backside coating layer 203 includes a chromium nitride ($Cr_xN_y$) layer. In some examples, substrate 202 has a thickness of about 6.3 to 6.5 mm. By way of example, the multi-layer structure 204 may include molybdenum-silicon (Mo-Si) multi-layers deposited on top of the substrate 202 for example, using an ion deposition technique. In some embodiments, the multi-layer structure 204 has a thickness of about 250-350 nm, and in some examples each Mo—Si layer pair has a thickness of about 3 nm (for the Mo layer) and about 4 nm (for the Si layer). The desired diffraction characteristics may impact the thickness and/or number of layers of the multi-layer structure 204. In various embodiments, the capping layer 206 includes a ruthenium (Ru) capping layer, a Si capping layer, and/or other suitable materials that may help to protect the multi-layer structure 204 (e.g., during fabrication or use of the mask 108). In some embodiments, the absorbers 208 may include for example, a $Ta_xN_y$ layer or a $Ta_xB_yO_zN_u$ layer, which may have a thickness of about 50-75 nm and are configured to absorb EUV light (e.g., with a wavelength of about 13.5 nm). In some examples, other materials may be used for the absorbers 208, including, for example, Al, Cr, Ta, W, and/or other suitable compositions. In some examples, the ARC layer 210 includes at least one of a $Ta_xB_yO_zN_u$ layer, a $Hf_xO_y$ layer, or a $Si_xO_yN_z$ layer. While some examples of materials that may be used for each of the substrate 202, the backside coating layer 203, the multi-layer structure 204, the capping layer 206, the absorbers 208, and the ARC layer 210 have been given, it will be understood that other suitable materials as known in the art may be equally used without departing from the scope of the present disclosure. Similarly, other mask configurations may also be provided as the mask 108.

Exemplary fabrication methods for the mask 108 are briefly summarized below. Again, these steps are exemplary and not intended to be limiting beyond what is specifically provided in the claims recited below. In some embodiments, the fabrication process includes two process stages: (1) a mask blank fabrication process, and (2) a mask patterning process. During the mask blank fabrication process, the mask blank is formed by depositing suitable layers (e.g., reflective multiple layers such as Mo-Si multi-layers) on a suitable substrate (e.g., an LTEM substrate having a flat, defect free surface). By way of example, a capping layer (e.g., ruthenium) is formed over the multilayer coated substrate followed by deposition of an absorber layer. The mask blank may then be patterned (e.g., the absorber layer is patterned) to form a desired pattern on the mask 108. In some embodiments, an ARC layer may be deposited over the absorber layer prior to patterning the mask blank. The patterned mask 108 may then be used to transfer circuit and/or device patterns onto a semiconductor wafer. In various embodiments, the patterns defined by the mask 108 can be transferred over and over onto multiple wafers through various lithography processes. In addition, a set of masks (such as the mask 108) may be used to construct a complete integrated circuit (IC) device and/or circuit.

In various embodiments, the mask 108 (described above) may be fabricated to include different structure types such as, for example, a binary intensity mask (BIM) or a phase-shifting mask (PSM). An exemplary BIM includes opaque absorbing regions and reflective regions, where the BIM includes a pattern (e.g., and IC pattern) to be transferred to the semiconductor substrate 116. The opaque absorbing regions include an absorber, as described above, that is configured to absorb incident light (e.g., incident EUV light). In the reflective regions, the absorber has been removed (e.g., during the mask patterning process described above) and the incident light is reflected by the multi-layer. Additionally, in some embodiments, the mask 108 may include a PSM which utilizes interference produced by phase differences of light passing therethrough. Examples of PSMs include an alternating PSM (AltPSM), an attenuated PSM (AttPSM), and a chromeless PSM (cPSM). For example, an AltPSM may include phase shifters (of opposing phases) disposed on either side of each patterned mask feature. In some examples, an AttPSM may include an absorber layer having a transmittance greater than zero (e.g., Mo—Si having about a 6% intensity transmittance). In some cases, a cPSM may be described as a 100% transmission AltPSM, for example, because the cPSM does not include phase shifter material or chrome on the mask.

As described above, the mask 108 includes a patterned image that may be used to transfer circuit and/or device patterns onto a semiconductor wafer (e.g., the semiconductor substrate 116) by the lithography system 100. To achieve a desirably high fidelity pattern transfer from the patterned mask 108 to the semiconductor substrate 116, introduction of defects onto the mask 108 may be desired to be reduced and/or avoided. As shown in FIG. 2, particles 212 may be unintentionally deposited on the surface of the mask 108. The particles 202 can result in degradation of lithographically transferred patterns if not removed. While the particles 212 are illustrated as having a circular shape, it will be understood that other particle shapes and sizes are possible, and are intended to fall within the scope of the present disclosure. Particles 212 may be introduced by any of a variety of fabrication methods, handling methods, and/or use of the mask 108 in the lithography system such as the lithography system 100.

One method of avoiding and/or removing particle contamination (e.g., particles 212) of a reflective EUV mask (e.g., the mask 108) may include cleaning process such as, a wet chemical processes. In some examples, such wet cleans may be performed with the addition of physical force. Cleans of the mask, such as mask 108, may be performed prior to or after mounting a pellicle onto the mask as discussed below.

Figure 3A:
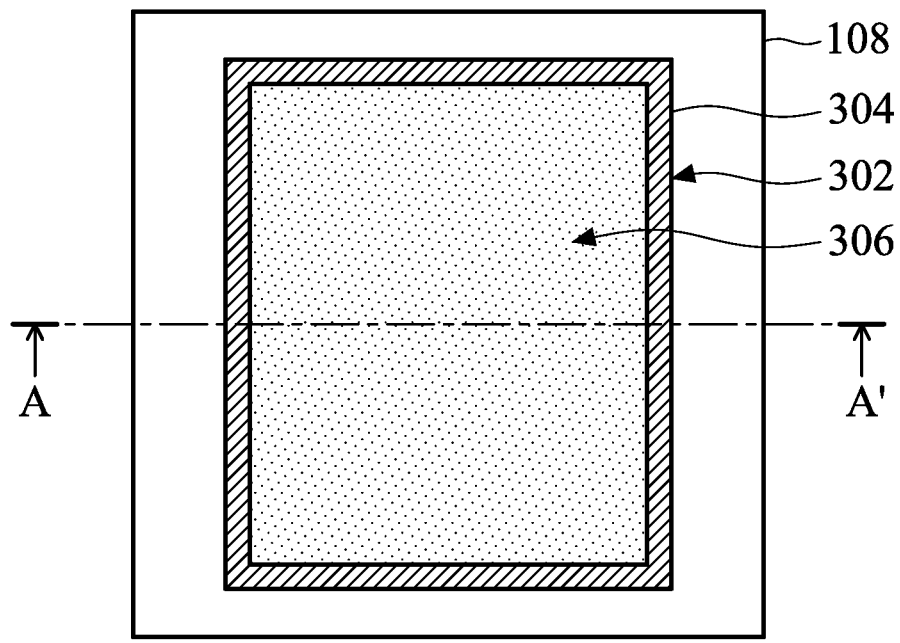
FIGS. 3A is a top-view and FIG. 3B is a cross-sectional view of a mask and pellicle, according to some embodiments.
Figure 3B:
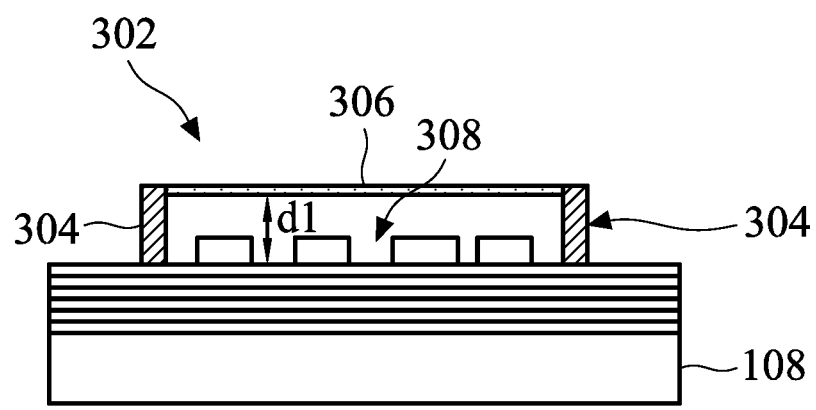

Alternatively or in addition to mask cleaning, a pellicle assembly (or simply a pellicle) may be used over a mask to serve as a protective cover. The pellicle assembly can serve to protects the mask from damage and/or contaminant particles. With reference to FIGS. 3A and 3B, illustrated therein is a top-view and a cross-sectional view, respectively, of a mask attached to a pellicle. In particular, FIGS. 3A/3B illustrate a mask 108, which may be substantially similar to as discussed above with reference to FIGS. 1 and 2, and a pellicle assembly 302. The pellicle assembly 302 or simply pellicle 302 includes a pellicle frame 304, and a pellicle membrane 306.

As discussed above, the mask 108 includes a patterned surface 308 used to pattern an image into a semiconductor substrate by a lithographic process. By way of example, the pellicle 302 is mounted such that the pellicle membrane 306 is suspended (e.g., by the pellicle frame 304) a distance 'd1' away from the patterned surface 308 of the mask 108. In an embodiment, the distance 'd1' is several millimeters. The pellicle membrane 306 is within an optical path between the patterned surface 308 of the mask 108 and a target substrate (e.g., wafer) to be patterned. In this manner, any particle which land on the pellicle membrane 306 is held away from a focal plane of the projection optics such as the projection optics 110 discussed above. As such, the particle may not be imaged onto a target substrate. In contrast, without the use of the pellicle membrane 306 a particle may instead be incident the patterned surface 308, thus within the focal plane and more likely imaged onto the target substrate.

The design of the pellicle membrane 306 can affect the EUV process. For example, the pellicle membrane 306 must have a suitable material and thickness in order to avoid undesired EUV absorption. Other considerations of the pellicle membrane 306 are also important. During an exposure process, when EUV light hits the pellicle membrane 306, the temperature of the pellicle membrane may increase. Thus, the thermal properties of the pellicle membrane 306 are important. In particular, increases in temperature may cause excessive stress and lead to the pellicle membrane deformation and transmission decrease. Additionally, in some embodiments the pellicle membrane desirably remains stable at a target power for the EUV lithography process. Pellicle configurations that may address one or more of these aspects of the use of pellicles are discussed below.

In particular, embodiments of the present disclosure offer advantages over the existing art, though it is understood that other embodiments may offer different advantages, not all advantages are necessarily discussed herein, and no particular advantage is required for all embodiments. For example, embodiments of the present disclosure provide exemplary pellicle assemblies which employ advantageous material and configurations as discussed below.

Figure 4:
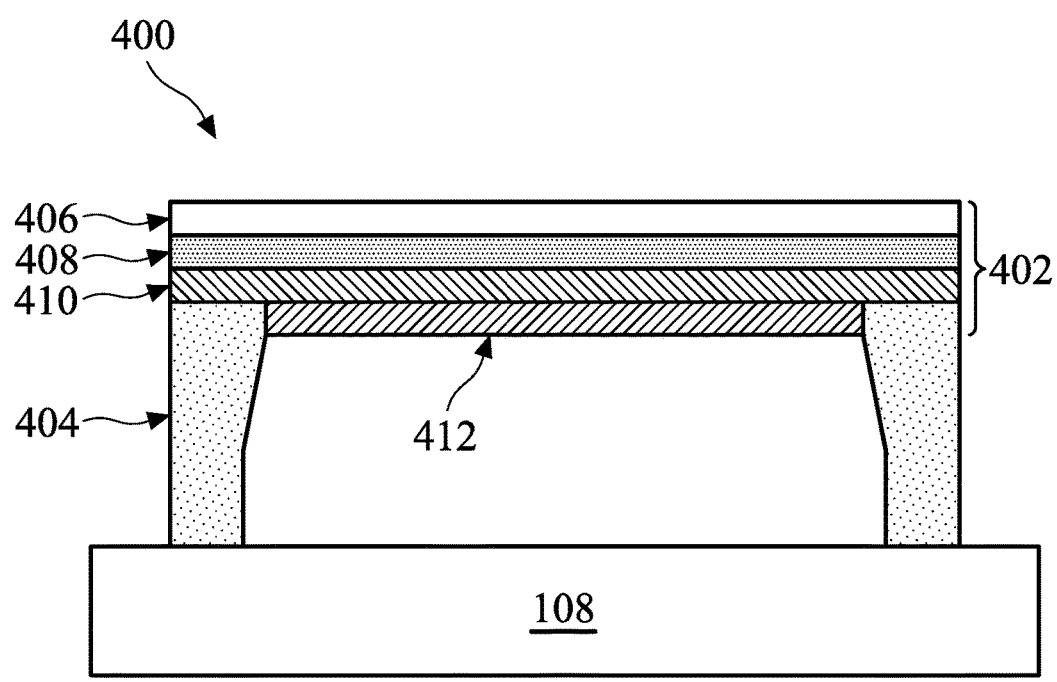
FIG. 4 is a cross-sectional view of an embodiment of a pellicle, according to one or more aspects of the present disclosure.

Referring now to FIG. 4, illustrated is a pellicle assembly (or simply, pellicle) 400. The pellicle 400 includes a pellicle membrane stack 402 and a pellicle frame 404. The pellicle membrane stack 402 may be substantially similar to the pellicle membrane 306, described above with respect to FIGS. 3A/3B; the pellicle frame 404 may be substantially similar to the pellicle frame 304, described above with respect to FIGS. 3A/3B. In some embodiments, the pellicle 400 is used in the system 100 and/or in conjunction with the mask 108 described above with reference to FIGS. 1, 2, 3A and 3B.

The pellicle frame 404 may include a suitable material such as aluminum, stainless steel, polyethylene, and/or other suitable materials. In some embodiments, small holes are disposed in the pellicle frame 404 to accommodate air pressure equivalence. The pellicle frame 404 may include various layers including for example, adhesive coatings, mounting adhesives, and the like in addition to the frame material itself. In some embodiments, mounting adhesives secure the pellicle frame 404 to the mask such as mask 108.

In an embodiment, the pellicle frame 404 has a height that extends from the mask 108 to a height H. The height H is provided such that it is out of the depth-of-focus. For example, the height H may be between approximately 5 and 10 millimeters, thus out of the focal plane which may be less than a micron. The height H may also be provided such that the light intensity is not overly degraded.

Attached to an upper portion (e.g., surface) of the pellicle frame 404 is a pellicle membrane stack (or simply pellicle membrane) 402. In the embodiment of the system 400 of FIG. 4, a pellicle membrane stack 402 is provided. The pellicle membrane stack 402 includes a plurality of layers including a first layer 406, a second layer 408, a third layer 410, and a fourth layer 412. In an embodiment, the first, second, third, and fourth layers 406, 408, 410 and 412 are configured as illustrated namely with an interface between the first layer 406 and the second layer 408; an interface between the second layer 408 and the third layer 410; an interface between the third layer 410 and the fourth layer 412. In an embodiment, the fourth layer 412 is a bottom layer, which faces (e.g., is the nearest layer to) an underlying mask such as mask 108 discussed above. In some embodiments, additional layers may be included in the pellicle stack 402 including, for example, interposing layers 406, 408, and/or 410.

The first layer 406, the second layer 408, and the third layer 410 may be referred to as the core pellicle material layers. In an embodiment, the first layer 406 is silicon nitride. In an embodiment, the second layer 408 is polysilicon (p-Si). In an embodiment, the third layer 410 is silicon nitride. Thus, in some embodiments, the pellicle membrane stack 402 includes a core pellicle material of SiN/p-Si/SiN stack. As illustrated in FIG. 4, in some embodiments a bottom surface of the bottommost layer of the core pellicle material layers, in this case, the bottom surface of the third layer 410, is disposed directly on the pellicle frame 404.

The fourth layer 412 of the pellicle material stack 402 may be a material meeting one or more of criteria for thermal emissivity, transmittance, and/or reflective index. Thermal emissivity is a measure of a material's effective ability to emit thermal radiation from its surface and having a maximum value of 1 (unitless). Transmittance is a measurement of the ratio of the light energy falling on the layer to that transmitted through it. The refractive index (n) (also referred to as index of refraction) is a dimensionless number that describes how light propagates through that medium and is defined as n=c/v where c is the speed of light in vacuum and v is the phase velocity of light in the medium. The refractive index determines how much light is bent, or refracted, when entering a material. In an embodiment, the material of the fourth layer 412 has a thermal emissivity greater than approximately 0.2; transmittance greater than approximately 80%, and/or a refractive index (n) at 13.5 nm, 193 nm of greater than approximately 0.9.

In an embodiment, the fourth layer 412 is silicon carbide. Thus, in an embodiment, the pellicle membrane stack 402 includes a silicon nitride layer (406), a polysilicon layer (408), a silicon nitride layer (410), and a silicon carbide layer (412).

In another embodiment, the fourth layer 412 is at least one of Ir, Y, Zr, Mo, Nb and their alloy, B4C, Si, SiC, SiN and their carbonitride or oxynitride. As discussed herein, the emissivity and/or transmittance of the layer, including fourth layer 412, is dependent upon its thickness and the thickness of the layer including fourth layer 412 is selected to provide the desired properties as discussed herein.

In an embodiment, the thickness of layer 412 (e.g., SiC) is between approximately 10 nm and approximately 25 nm. The thickness of the layer 412 may be determined based on the desired transmittance. See FIG. 7. It is also noted that a thickness of layer 412 that is too thin may experience discontinuities that affect it performance including uniformity of thermal and transmittance capabilities.

In an exemplary embodiment, the first layer 406 (e.g., SiN) is approximately 2.5 nanometers (nm), the second layer 408 (e.g., polysilicon) is approximately 4 nm, and/or the third layer 410 is approximately 2.5 nm. In a further embodiment, the fourth layer 412 is approximately 20 nm.

In an embodiment, emissivity is equal to about 0.83 for layer 412 of SiC. In an embodiment, transmittance is equal to about 90% for layer 412 of SiC. In an embodiment, the transmittance of layer 412 is 91.4% for 20 nm of layer 412 of SiC.

In an embodiment, EUV reflectivity can be eliminated by approximately 5% by using the fourth layer 412 having a composition meeting the description above. For example, in an embodiment the stack-up includes a Ru layer (as opposed to layer 412), the EUV reflectivity may be approximately 0.42; whereas providing the layer 412 (e.g., as SiC) can reduce the reflectivity to approximately 0.02.

The light sources (e.g., EUV sources) can emit light over a wide spectral range, including out-of-band (OOB) radiation, in addition to the desired wavelength. The OOB radiation can expose resists depending on the sensitivity of the material, and this exposure can result in resist film thickness loss, pattern reproducibility issues, and/or other issues. In an embodiment, the layer 412 has properties (e.g., transmittance) configured to reduce the out-of-band effect. In some embodiments, the out-of-band effect is reduced by 13.5 to 350 nanometers in comparison with a pellicle membrane that omits layer 412 (e.g., in favor of a Ru layer).

In an embodiment, the fourth layer 412 is a bottom layer, which faces (e.g., nearest layer to) an underlying mask such as mask 108 discussed above. One advantage of this configuration is an improvement of the thermal emissivity. That is, upon irradiation of the pellicle 400 and the associated mask, heat may be generated may be effectively emitted by a suitable composition of the fourth layer 412 (e.g., a thermal emissivity of greater than 0.2 (e.g., SiC).

As illustrated in FIG. 4, the fourth layer 412 may be disposed adjacent the pellicle frame 404 such that a sidewall of the fourth layer 412 abuts a sidewall of the pellicle frame 404. In other embodiments, the configuration of the fourth layer 412 may be different, for example, extending under the length of the third layer 410.

In an embodiment, one or more of the layers of the membrane stack 402 including fourth layer 412 are deposited by chemical vapor deposition (CVD) process such as, for example, atmospheric pressure CVD process (APCVD); a low pressure CVD process (LPCVD); a laser-enhanced CVD process (LECVD); and/or a plasma enhanced CVD process (PECVD). In an embodiment, one or more of the layers of the membrane stack 402 including fourth layer 412 are deposited by physical vapor deposition (PVD) process such as, for example, electrically heated evaporation sources (Thermal evaporation), pulsed laser deposition, electron-beam evaporation, molecular beam epitaxy, ion beam assisted evaporation, and/or discharge based deposition methods (e.g., sputtering, arc evaporation).

In another embodiment, the fourth layer 412 is disposed over the first layer 406. In an embodiment, the bottom surface of the fourth layer 412 physically interfaces with the top surface of the first layer 406. The fourth layer 412 may be substantially similar to as discussed above. In an embodiment where the fourth layer 412 is disposed over the first layer 406, the stack 402 may have an advantage of providing thermal emissivity for the pellicle membrane stack 402 and/or pellicle 400 generally.

It is noted that in an embodiment, a ruthenium (Ru) layer is not included in the pellicle membrane stack 402 or the pellicle 400 generally. While benefits of Ru layers may increase thermal emissivity during the irradiation with EUV light, the inclusion of Ru may provide a stack of the membrane that undesirably reflects EUV light. This can cause a critical dimension (CD) drop at a field edge. Thus, in some embodiments, the pellicle 400 and the pellicle membrane stack 402 do not include Ru and do include the fourth layer 412 as discussed above.

Figure 5:
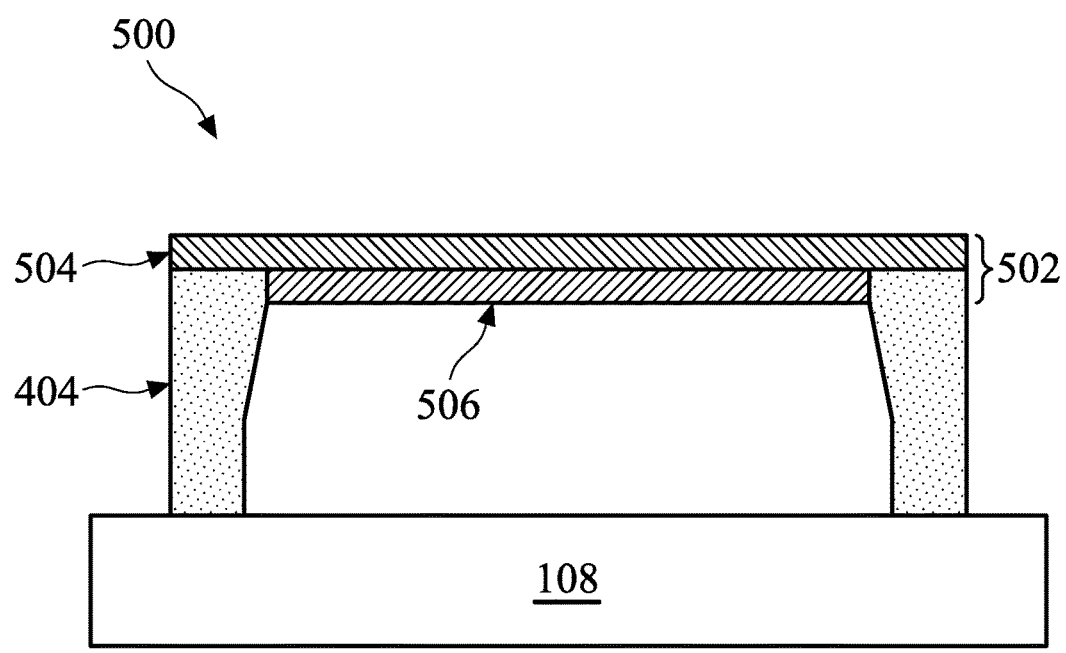
FIG. 5 is a cross-sectional view of another embodiment of a pellicle, according to one or more aspects of the present disclosure.

Referring now to FIG. 5, illustrated is a pellicle assembly (or simply, pellicle) 500. The pellicle 500 includes a pellicle membrane stack 502 and a pellicle frame 404. The pellicle membrane stack 502 may be substantially similar to the pellicle membrane 306, described above with respect to FIGS. 3A/3B; the pellicle frame 404 may be substantially similar to the pellicle frame 304, described above with respect to FIGS. 3A/3B. The pellicle frame 404 may be substantially similar to the similar pellicle frame 404 of the pellicle assembly 400, described above with reference to FIG. 4. In some embodiments, the pellicle 500 is used in the system 100 and/or in conjunction with the mask 108 described above with reference to FIGS. 1, 2, 3A, and 3B.

The pellicle membrane stack 502 includes a first layer 504 and a second layer 506. In some embodiments, the pellicle 500 includes only these two layers as the pellicle membrane. In an embodiment, the first and second layers 504 and 506 are configured as illustrated namely with an interface between the first layer 504 and the second layer 506. In an embodiment, the second layer 506 is a bottom layer, which faces (e.g., nearest layer to) an underlying mask such as mask 108 discussed above. The second layer 506 may serve to provide thermal emissivity for the pellicle 500. The first layer 504 may also be referred to as the core material of the pellicle membrane stack 502.

In an embodiment, the first layer 504 is ruthenium (Ru). The first layer 504 may be between approximately 0.1 and 50 nm in thickness. In an embodiment, the first layer 504 is approximately 7 nm. The thickness of the first layer 504 may be selected such as to provide suitable transmission and structural performance.

The second layer 506 may be a material meeting one or more of criteria for thermal emissivity, transmittance, and/or reflective index. In an embodiment, the material of the second layer 506 has a thermal emissivity greater than approximately 0.2; transmittance greater than approximately 80% and/or a refractive index (n) at 13.5 nm, 193 nm of greater than approximately 0.9.

In an embodiment, the second layer 506 is silicon carbide. Thus, in an embodiment, the pellicle membrane stack 502 includes a Ru layer (504) and a silicon carbide layer (506). In some embodiments, the second layer 506 may be at least one of Ir, Y, Zr, Mo, Nb and their alloy, $B_4C$, Si, SiC, SiN and their carbonitride or oxynitide. In addition to selecting the composition of the second layer 506, the thickness of the second layer 506 is also selected as discussed below to provide the relevant emissivity and transmittance to provide the desired properties (e.g., a thermal emissivity greater than approximately 0.2; transmittance greater than approximately 80% and/or a refractive index (n) at 13.5 nm, 193 nm of greater than approximately 0.9).

In an embodiment, the thickness of layer 506 (e.g., SiC) is between approximately 10 nm and approximately 25 nm. The thickness of the layer 506 may be determined based on the desired transmittance. See FIG. 7. It is also noted that a thickness of layer 506 that is too thin may experience discontinuities that affect it performance including uniformity of thermal and transmittance capabilities.

In an embodiment, the pellicle membrane stack 502 includes a first layer 504 of Ru at a thickness of approximately 7 nm and a second layer 506 of SiC at a thickness of approximately 30 nm. In other words, a total thickness of the stack 502 may be approximately 37 nm. The exemplary embodiment can provide an EUV transmittance of approximately 80%; a thermal emissivity of about 0.4; an EUV radiation of less than approximately 0.04; a transmission percentage (at 193 nm wavelength source) of 45%; and/or a transmission percentage (at 248 nm wavelength source) of greater that approximately 70%. An indication of the mechanical strength of a material may be given by the Young's modulus value for the material, where the Young's modulus is a measure of the stiffness of the material. By way of example, the Young's modulus of approximately 450 MPa may be provided by the exemplary embodiment.

In an embodiment, the second layer 506 is a bottom layer, which faces (e.g., nearest layer to) an underlying mask such as mask 108 discussed above. One advantage of this configuration is an improvement of the thermal emissivity. That is, upon irradiation of the pellicle 500 and the associated mask, heat may be generated may be effectively emitted by a suitable composition of the second layer 506 (e.g., a thermal emissivity of greater than 0.2 (e.g., SiC).

As illustrated in FIG. 5, the second layer 506 may be disposed adjacent the pellicle frame 404 such that a sidewall of the second layer 506 abuts a sidewall of the pellicle frame 404. In other embodiments, the configuration of the second layer 506 may be different, for example, extending under the length of the first layer 504.

In an embodiment, one or more of the layers of the pellicle membrane stack 502 are deposited by chemical vapor deposition (CVD) process such as, for example, atmospheric pressure CVD process (APCVD); a low pressure CVD process (LPCVD); a laser-enhanced CVD process (LECVD); and/or a plasma enhanced CVD process (PECVD). In an embodiment, one or more of the layers of the membrane stack 502 are deposited by physical vapor deposition (PVD) process such as, for example, electrically heated evaporation sources (Thermal evaporation), pulsed laser deposition, electron-beam evaporation, molecular beam epitaxy, ion beam assisted evaporation, and/or discharge based deposition methods (e.g., sputtering, arc evaporation).

In another embodiment, the second layer 506 is disposed over the first layer 504. For example, in some embodiments, the second layer 506 is disposed over and not under the first layer 504. In an embodiment, the bottom surface of the second layer 506 physically interfaces with the top surface of the first layer 504. The second layer 506 may be substantially similar to as discussed above. In an embodiment where the second layer 506 is disposed over the first layer 504, the stack 502 may have an advantage of providing thermal dissipation and/or desired transmittance.

Thus, embodiments of the pellicle membranes disclosed herein have excellent transmission and thermal properties. For example, because of their improved thermal emissivity of the respective layers (e.g., layer 506, layer 412 respectively) the pellicle configurations allow for temperatures of the respective pellicle membranes to remain lower during the EUV exposure processing. As discussed above, some embodiments also provide relatively higher EUV transmittance (e.g., through use of the layer 412, layer 506). Those skilled in the art will recognize other benefits and advantages of the methods and structures as described herein, and the embodiments described are not meant to be limiting beyond what is specifically recited in the claims that follow.

Figure 6:
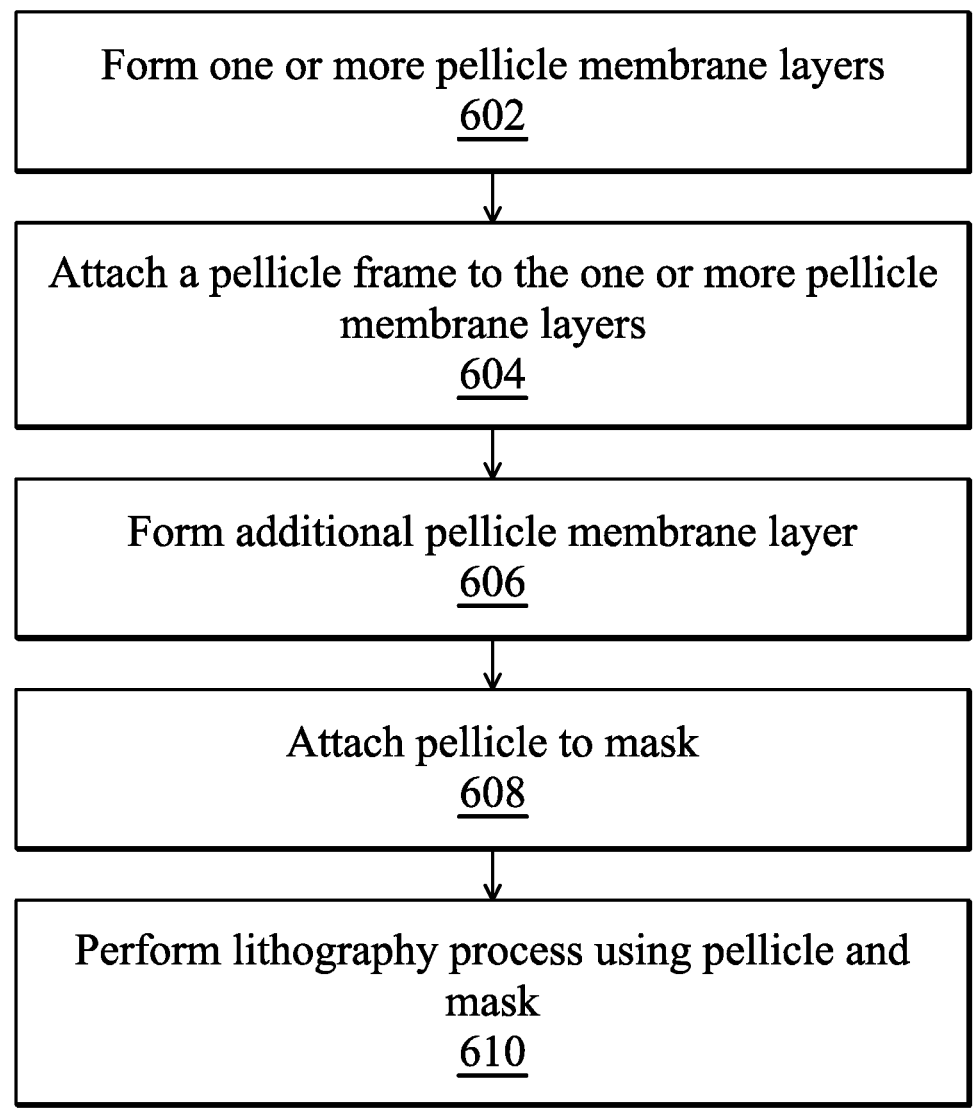
FIG. 6 is a flow chart illustrating an embodiment of a method of lithography, according to one or more aspects of the present disclosure.

Referring now to FIG. 6, illustrated is a method 600 for forming a pellicle and performing a lithography process. To be sure, the method steps as to forming the pellicle do not necessitate performance of the lithography process using said pellicle. Likewise, performing the lithography process using a pellicle formed according to one or more aspects of the present disclosure does not require fabrication of said pellicle being performed in conjunction with the lithography process.

The method 600 begins at block 602 where a one or more layers of pellicle membrane are formed. The pellicle membrane layers formed in block 602 may be referred to as the core pellicle membrane layers. In some embodiments, the plurality of pellicle membrane layers may be substantially similar to the first, second and third layers 406, 408 and 410 as discussed above with reference to the pellicle 400 and FIG. 4. In some embodiments, one pellicle membrane layer may be formed. In a further embodiment, the pellicle membrane layer formed may be substantially similar to the first layer 504 as discussed above with reference to the pellicle 500 and FIG. 5.

In some embodiments, to form the one or more pellicle membrane layers a substrate is provided upon which the pellicle membrane layers are formed. By way of example, the substrate may include a silicon substrate. In some embodiments, the substrate may alternatively and/or additionally include germanium, silicon-germanium, another III-V compound, one or more thin film layers, glass, dielectric materials, and/or other suitable substrate material.

The one or more of the layers formed in block 602 may be deposited by chemical vapor deposition (CVD) process such as, for example, atmospheric pressure CVD process (APCVD); a low pressure CVD process (LPCVD); a laser-enhanced CVD process (LECVD); and/or a plasma enhanced CVD process (PECVD). In embodiment, the additional pellicle material layer may be deposited by physical vapor deposition (PVD) process such as, for example, electrically heated evaporation sources (Thermal evaporation), pulsed laser deposition, electron-beam evaporation, molecular beam epitaxy, ion beam assisted evaporation, and/or discharge based deposition methods (e.g., sputtering, arc evaporation).

As indicated above, in some embodiments, pellicle material layers substantially similar to layers 406, 408, and 410 are formed on a substrate (e.g., SiN, poly-Si, SiN). In some embodiments, a pellicle material layer substantially similar to layer 504 (e.g., Ru) is formed on a substrate.

Proceeding to block 604 of the method 600, after formation of one or more pellicle membrane layers on the substrate, the method proceeds in some embodiments to provide a pellicle frame mounted onto the pellicle membrane layer(s) provided in block 604. The pellicle frame may be mounted to at least one of the pellicle membrane layers by way of an adhesive (e.g., glue) layer. In other embodiments of the method 600, block 606 and the formation of the additional pellicle membrane layer may be performed prior to attaching the membrane to the pellicle frame.

The method 600 then proceeds to block 606 where an additional pellicle membrane layer is formed on the pellicle membrane layers of block 602. In an embodiment, the additional pellicle membrane layer may serve to improve the thermal emissivity of the pellicle membrane stack. In some embodiments, the additional pellicle membrane layer may be substantially similar to the fourth layer 412 described above with reference to the pellicle 400 and FIG. 4. In some embodiments, the additional pellicle membrane layer may be substantially similar to the second layer 506 described above with reference to the pellicle 500 and FIG. 5. Thus, in an embodiment, the additional pellicle layer is SiC.

By way of example, the additional pellicle membrane layer may have a thickness between approximately 10 and 25 nanometers as discussed above. The additional pellicle membrane layer is deposited by chemical vapor deposition (CVD) process such as, for example, atmospheric pressure CVD process (APCVD); a low pressure CVD process (LPCVD); a laser-enhanced CVD process (LECVD); and/or a plasma enhanced CVD process (PECVD). In embodiment, the additional pellicle material layer may be deposited by physical vapor deposition (PVD) process such as, for example, electrically heated evaporation sources (Thermal evaporation), pulsed laser deposition, electron-beam evaporation, molecular beam epitaxy, ion beam assisted evaporation, and/or discharge based deposition methods (e.g., sputtering, arc evaporation).

As discussed above, in some embodiments after the formation of the additional pellicle material layer in block 606, the formed membrane is attached to the pellicle frame. For example, in some embodiments, each and every layer of the membrane are formed prior to attaching the membrane to the pellicle frame.

The method 600 then proceeds to block 608 where the pellicle is attached to the mask. The pellicle may be attached using suitable adhesive material. The figures described above, including FIGS. 3A/3B provide exemplary mounting of the pellicle onto the mask.

The method 600 then proceeds to block 610 where a lithography process is performed using the pellicle mounted to the mask. The lithography process may be performed by a system such as the exemplary system 100, described above with reference to FIG. 1. A target substrate, such as a wafer, is coated with resist sensitive to the radiation source (e.g., EUV). The target substrate is then exposed in the lithography system using the mask having the pellicle mounted thereto to define a pattern that is imaged onto the target substrate. As discussed above, the light from the source passes through the pellicle and is incident the mask attached thereto. The pellicle may serve to improve the performance of the fidelity of the imaged pattern due to reduction of particles on the mask. The method may continue to other steps including developing the imaged resist pattern.

Figure 7:
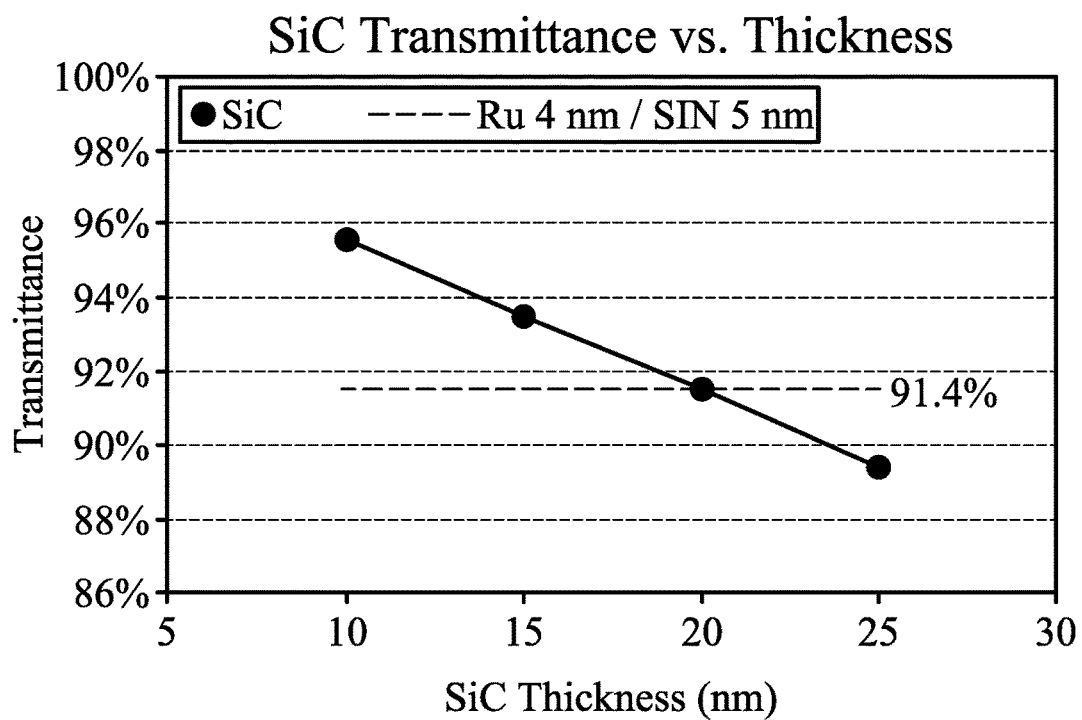
FIG. 7 illustrates a graphical representation of some experimental data associated with some embodiments according to one or more aspects of the present disclosure.

Referring to FIG. 7 illustrated is a graphical representation of a thickness of a pellicle layer relative to the transmittance. Specifically fitted line 702 illustrates the thickness of SiC in nanometers related to the transmittance. Fitted line 704 illustrates transmittance with respect to a Ru/SiN stack. The Ru/SiN may have a thickness of approximately 4 nm/5 nm. As indicated by FIG. 7, the SiC transmittance provides advantages to a pellicle stack substantially as discussed above.

Thus, provided are embodiments of pellicles and methods of fabricating pellicles that provide for numerous advantages as discussed above including, but not limited, improved transmittance, thermal emissivity, reduction of OOB effect, and/or other properties. One or more of these improvements may be provided by the configuration of materials of the core pellicle membrane in conjunction with additional layers (e.g., thermal emissivity) such as layers 412 and 506 respectively.

Thus, embodiments of the present disclosure described a structure including an EUV mask and a pellicle attached to the EUV mask. The pellicle includes a pellicle frame and a plurality of pellicle membrane layers attached to the pellicle frame. The plurality of pellicle membrane layers include at least one core pellicle membrane layer. The plurality of pellicle membrane layers further include an additional pellicle membrane layer disposed on the at least one core pellicle membrane layer and being a nearest adjacent layer of the plurality of pellicle membrane layers to the EUV mask. In some embodiments, the additional pellicle membrane layer is silicon carbide (SiC).

In another of the broader structures discussed herein, a structure including an EUV mask and a pellicle attached to the EUV mask. The pellicle includes a pellicle frame and a plurality of pellicle membrane layers attached to the pellicle frame. The plurality of pellicle membrane layers include at least one core pellicle membrane layer and an additional pellicle membrane layer is disposed on the at least one core pellicle membrane layer. The additional pellicle membrane was the nearest adjacent layer of the plurality of pellicle membrane layers to the EUV mask. In some embodiments, the additional pellicle membrane layer is a material having a thermal emissivity greater than 0.2, a transmittance greater than 80%, and a refractive index (n) for 13.5 nanometer source of greater than 0.9.

Also provided is a method including providing an EUV lithographic mask including a patterned surface forming at least one pellicle membrane layer. The method attaching a pellicle frame to the at least one pellicle membrane layer. After the attaching, the method includes forming another membrane layer on the at least one pellicle membrane layer. The another membrane layer is a material having a property of having a thermal emissivity greater than 0.2, a transmittance greater than 80%, and a refractive index (n) for 13.5 nanometer source of greater than 0.9. A pellicle including the pellicle frame, the at least one pellicle membrane layer, and the another membrane layer is mounted to the EUV lithographic mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   an EUV mask;
   a pellicle attached to the EUV mask, wherein the pellicle includes:
   a pellicle frame;
   a plurality of pellicle membrane layers attached to the pellicle frame, wherein the plurality of pellicle membrane layers include:
   at least one core pellicle membrane layer; and
   an additional pellicle membrane layer disposed on the at least one core pellicle membrane layer and being a nearest adjacent layer of the plurality of pellicle membrane layers to the EUV mask, wherein the additional pellicle membrane layer is at least one of Ir, Y, Zr, Mo, Nb or their alloys, $B_4C$, Si, SiC, SiN, their carbonitride, or their oxynitride.

2. The structure of claim 1, wherein the additional pellicle membrane layer has a thickness of between 10 nm and 25 nm.

3. The structure of claim 1, wherein the at least one core pellicle membrane layer includes a layer of ruthenium.

4. The structure of claim 3, wherein the layer of ruthenium defines a top surface of the pellicle and the additional pellicle membrane layer directly interfaces the layer of ruthenium.

5. The structure of claim 1, wherein the at least one core pellicle membrane layer includes a first layer of silicon nitride, a second layer of polysilicon and a third layer of silicon nitride.

6. The structure of claim 5, wherein the SiC directly interfaces the third layer of silicon nitride.

7. The structure of claim 6, wherein the first layer of silicon nitride provides a top surface of the pellicle.

8. A structure, comprising:
an EUV mask;
a pellicle attached to the EUV mask, wherein the pellicle includes:
a pellicle frame;
a plurality of pellicle membrane layers attached to the pellicle frame, wherein the plurality of pellicle membrane layers include:
at least one core pellicle membrane layer; and
an additional pellicle membrane layer disposed on the at least one core pellicle membrane layer and being a nearest adjacent layer of the plurality of pellicle membrane layers to the EUV mask, wherein the additional pellicle membrane layer is a material having at least one of a thermal emissivity greater than 0.2, a transmittance greater than 80%, or a refractive index (n) for 13.5 nanometer source of greater than 0.9.

9. The structure of claim 8, wherein the additional pellicle membrane layer is SiC.

10. The structure of claim 8, wherein a thickness of the additional pellicle membrane layer is between approximately 10 and 25 nanometers (nm).

11. The structure of claim 8, wherein the at least one core pellicle membrane layer is a single layer of ruthenium.

12. The structure of claim 8, wherein the at least one core pellicle membrane layer is a stack of layers including a first silicon nitride layer and a second silicon nitride layer interposed by a polysilicon layer.

13. The structure of claim 8, wherein the additional pellicle membrane layer is at least one of Ir, Y, Zr, Mo, Nb and their alloy, $B_4C$, Si, SiC, SiN, their carbonitride, or their oxynitride.

14. The structure of claim 8, wherein the pellicle frame has a first physical interface with the at least one core pellicle membrane layer and a second physical interface with the additional pellicle membrane layer.

15. The structure of claim 14, wherein the second physical interface is a sidewall wall of the second physical interface and wherein the first physical interface is a bottom surface of the at least one core pellicle membrane layer.

16. A structure, comprising:
an EUV mask;
a pellicle attached to the EUV mask, wherein the pellicle includes:
a pellicle frame; and
a plurality of pellicle membrane layers attached to the pellicle frame, wherein the plurality of pellicle membrane layers include:
at least one core pellicle membrane layer; and
an additional pellicle membrane layer disposed on the at least one core pellicle membrane layer, interfacing the pellicle frame and being nearer to the EUV mask than the at least one core pellicle membrane layer, wherein the additional pellicle membrane layer includes SiC.

17. The structure of claim 16, wherein the additional pellicle membrane layer directly interfaces the at least one core pellicle membrane layer.

18. The structure of claim 17, wherein the at least one core pellicle membrane layer is a layer of ruthenium.

19. The structure of claim 17, wherein a thermal emissivity of the additional pellicle membrane layer is greater than 0.2, a transmittance of the additional pellicle membrane layer is greater than 80%, and a refractive index (n) for 13.5 nanometer source of the additional pellicle membrane layer is greater than 0.9.

20. The structure of claim 17, wherein the at least one core pellicle membrane layer physically interfaces the pellicle frame and the additional pellicle membrane layer physically interfaces a sidewall of the pellicle frame.

* * * * *